United States Patent
Tomioka

[11] Patent Number: 5,869,376
[45] Date of Patent: Feb. 9, 1999

[54] PRODUCTION METHOD FOR SEMICONDUCTOR DEVICE HAVING FIELD-SHIELD ISOLATION STRUCTURE

[75] Inventor: Yugo Tomioka, Tateyama, Japan

[73] Assignee: Nippon Steel Semiconductor Corporation, Tateyama, Japan

[21] Appl. No.: 709,603

[22] Filed: Sep. 9, 1996

[30] Foreign Application Priority Data

Sep. 8, 1995 [JP] Japan .................................. 7-231824

[51] Int. Cl.$^6$ .............................. H01L 21/00; H01L 27/00
[52] U.S. Cl. ........................ 438/304; 438/305; 438/306; 438/307
[58] Field of Search ................... 438/304, 305, 438/306, 307

[56] References Cited

U.S. PATENT DOCUMENTS 5,243,219  9/1993  Katayama ................................ 257/400
5,604,138  2/1997  Lee et al. ................................ 438/307

FOREIGN PATENT DOCUMENTS 63-253640  10/1988  Japan .
2-161753   6/1990   Japan .
4-332162   11/1992  Japan .

Primary Examiner—Maria Nuzzolillo
Assistant Examiner—Laura Weiner
Attorney, Agent, or Firm—Oblon, Spivak, McClelland, Maier & Neustadt, P.C.

[57] ABSTRACT

The present invention has the object of offering a semiconductor production method which simplifies the fabrication of gate electrodes for MOS-type semiconductor elements and allows a high yield to be maintained. For this purpose, it has steps of forming a field-shield gate insulation film on a semiconductor substrate, forming polycrystalline silicon films having an etching rate which is greater at an upper side than a lower side thereon, and etching the polycrystalline silicon films under conditions which allow for side etching with the silicon oxide film as a mask, so as to make gradually tapered inclines on side walls of field-shield gate electrode.

8 Claims, 8 Drawing Sheets

5,869,376

PRODUCTION METHOD FOR SEMICONDUCTOR DEVICE HAVING FIELD-SHIELD ISOLATION STRUCTURE

BACKGROUND OF THE INVENTION

1. Technical Field of the Invention

The present invention relates to semiconductor device production methods, especially production methods for semiconductor devices having field-shield isolation structures.

2. Background Art

For semiconductor devices which use silicon as semiconductor substrates, LOCOS (Local Oxidation of Silicon) methods have conventionally been used as isolation methods for selectively forming thick thermal oxidation films on the substrates. However, with the LOCOS method, the oxide film regions which grow horizontally from the periphery of the thick thermal oxide film to the active region form obstacles to scaling down known as bird's beaks, so that attention has recently been turned to other techniques, such as field-shield isolation methods.

The field-shield isolation method is a method wherein a MOS structure (hereinafter referred to as a field-shield isolation structure) composed of a field-shield insulation film and a field-shield electrode is provided between the active regions forming the semiconductor element and the field-shield electrode is held at a standard electrical potential (for example, GND or 0 V), whereby parasitic channels are prevented from being formed in the substrate surface in order to isolate the active regions.

An example of a production method for semiconductor devices having field-shield isolation structures is disclosed in Japanese Patent Application, First Publication No. 2-211651. The production method described in this publication shall be explained below as a reference. FIG. 3 is a plan view showing a DRAM memory cell having a field-shield isolation structure, and FIGS. 4A~4L are process flow diagrams showing the DRAM memory cell production steps in order.

First, as shown in FIG. 4A, a silicon oxide film 2, a phosphorus-doped polycrystalline silicon film 3 and a silicon oxide film 4 are sequentially formed on the surface of a wafer W formed from a P-type silicon substrate 1. Next, as shown in FIG. 4B, the three films 2, 3 and 4 are patterned into a designated shape so as to form a field-shield gate oxide film 5, a field-shield gate electrode 6 and a field-shield gate cap insulation film 7.

Then, as shown in FIG. 4C, a silicon oxide film 8 is formed on the entire surface of the wafer W, after which side wall spacers 9 are formed by anisotropic etching as shown in FIG. 4D. Next, as shown in FIG. 4E, a silicon oxide film 10 is formed on the surface of the p-type silicon substrate 1, after which a phosphorus-doped polycrystalline silicon film 11 and silicon oxide film 12 are sequentially formed on the entire surface of the wafer W.

Thereafter, as shown in FIG. 4F, a gate oxide film 13, a gate electrode 14 and a gate cap insulation film 15 for a MOS transistor are formed by patterning the films 10, 11 and 12 into a designated shape. Next, as shown in FIG. 4G, an ion implantation of phosphorus is conducted while using these parts 13, 14 and 15 as a mask to form an n-type impurity diffusion layer 16, after which a silicon oxide film 17 is formed over the entire surface of the wafer W as shown in FIG. 4H.

Subsequently, as shown in FIG. 4I, side wall spacers 18 are formed at the side walls of the gate electrode 14 of the MOS transistor by anisotropic etching. Then, as shown in FIG. 4J, after forming a phosphorus-doped polycrystalline silicon film 19 over the entire surface of the wafer W, the bottom electrode 20 of a capacitor is formed by patterning this into a designated shape.

Then, as shown in FIG. 4K, a dielectric film 21 composed of a silicon nitride film is formed on the bottom electrode 20 of the capacitor, and a phosphorus-doped polycrystalline silicon film 22 is formed on the top surface thereof. This is then patterned into a designated shape to form the top electrode 23 of the capacitor as shown in FIG. 4L. Then, after forming an interlayer insulation film 24, contact holes 25 are opened at designated locations, and a wiring layer 28 is formed. A DRAM memory cell having a field-shield isolation structure is formed through the above-given steps.

In semiconductor devices such as the above-mentioned DRAM memory cell shown in FIG. 3, the active regions 26 which form the MOS-type semiconductor element (a MOS transistor in the above example) are defined to be the regions surrounded by the field-shield gate electrode 6. Additionally, with conventional production methods, the side walls of the field-shield gate electrodes 6 stand perpendicular with respect to the surface of the silicon substrate 1 as shown in FIGS. 4B~4L.

However, if these side walls are perpendicular, it is difficult to fabricate the gate electrodes 14 of the MOS transistor which extend from within the active regions 26 to the field-shield gate electrode 6 as shown in FIG. 3. That is, a step is formed on the gate electrodes 14 of the MOS transistor at the side wall portions of the field-shield gate electrode 6. However, these steps must be roughly perpendicular because the side walls of the field-shield gate electrodes 6 are roughly perpendicular, making the gate electrodes 14 of the MOS transistor extremely difficult to etch. Additionally, since etching residues can remain between the gate electrodes 14 (the portions indicated by the thick line and labelled with reference numeral 27 in FIG. 3), short circuits can often occur. While this problem can be somewhat relieved by forming a side wall spacer 9 on the side walls 6 of the field-shield gate electrodes 6, this is not sufficient. Additionally, this problem will get even worse as the active regions get smaller due to higher integration of elements, which could cause reduced yields.

Therefore, two methods have been proposed as means for solving this problem. The first method is described in Japanese Patent Application, First Publication No. 2-161753. With this method, the side walls of the field-shield gate electrodes are given an inclination by isotropically etching a conductive film having a single impurity concentration to form the field-shield gate electrodes. Additionally, the second method is described in Japanese Patent Application, First Publication No. 6-238599. With this method, the side walls of the field-shield gate electrodes are made into gradually tapered shapes by etching under conditions wherein the etching rate changes over time when the conductive film is etched.

However, the two above-mentioned methods also have problems. That is, while the side walls of the field-shield gate electrodes are inclined by means of isotropic etching with the first method, isotropic etching usually results in etched surfaces which are curved into concave shapes, so that the upper portions of the side walls become close to perpendicular and the problem is not fully solved. Additionally, since the etching rate is changed over time by changing the concentration of etchant with respect to a conductive film with a uniform impurity concentration according to the second method, the etchant concentration must be changed for each semiconductor wafer when etching, thus presenting problems such as reduced product throughput and poor etch controllability.

SUMMARY OF THE INVENTION

The present invention is provided for resolving the above-mentioned problems, and has the object of offering a semiconductor device production method which allows easier fabrication of gate electrodes for MOS-type semiconductor elements and is able to maintain high yields, in a production method for semiconductor devices having a field-shield isolation structure.

In order to achieve the above object, the production method for a semiconductor device according to the present invention comprises steps of forming a first insulation film, to be a field-shield gate insulation film, on a semiconductor substrate; forming a conductive film, wherein an upper portion has a higher etching rate than a lower portion under identical etching conditions, to be a field-shield gate electrode, on said first insulation film; forming a second insulation film on said conductive film; patterning said second insulation film into a designated shape; and etching said conductive film under conditions which allow for side etching with the patterned second insulation film as a mask, so as to make gradually tapered inclines on side walls of said conductive film.

Additionally, side wall spacers can be formed on said side walls of said conductive film after the gradually tapered inclines are made on said side walls of said conductive film. Also, at least two layers of films having different etching rates can be formed as a means for forming said conductive film. Specifically, the at least two layers of films can comprise at least two layers of polycrystalline silicon films implanted with different concentrations of impurities. Alternatively, as another means, said conductive film can be formed by forming a single polycrystalline silicon film while changing the concentration of implanted impurities over time during formation.

That is, according to the semiconductor device production method of the present invention, the conductive film to become the field-shield gate electrode has a property wherein the etching rate of a top portion is larger than that of a bottom portion under identical conditions, so that as long as etching is performed under conditions which allow for side etching when etching the conductive film, the field-shield gate electrode can be formed such that the side walls of the conductive film are given gradually tapered inclines, even without changing the etching conditions.

PREFERRED EMBODIMENTS OF THE INVENTION

Figure 1:
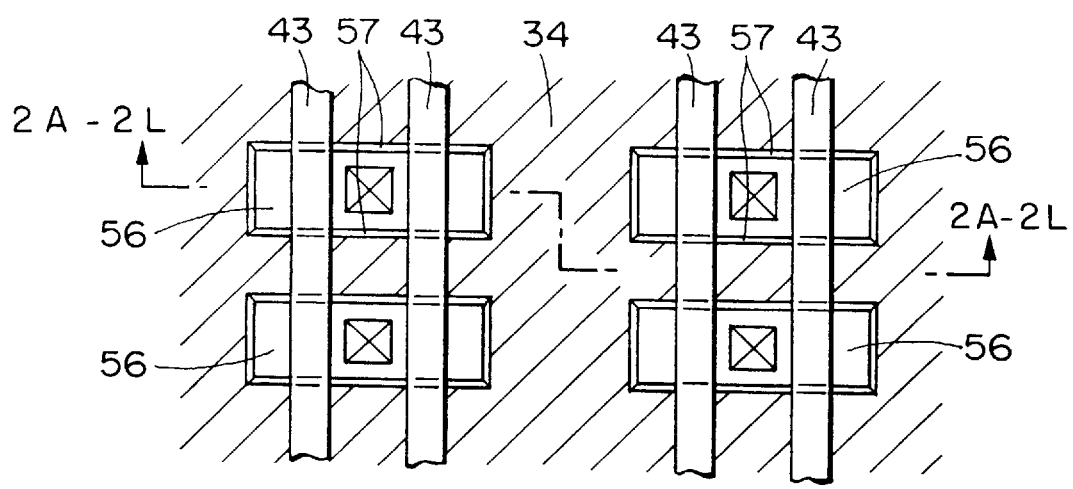
FIG. 1 is a plan view showing a DRAM memory cell according to a first embodiment of the present invention.

Hereinbelow, an example of an embodiment of the present invention will be explained. The present embodiment is an example wherein the production method of the present invention is applied to DRAM memory cells, and FIG. 1 is a plan view showing a DRAM memory cell, while FIGS. 2A~2L are process flow diagrams showing the DRAM memory cell production process in steps. Below, the production process will be explained with reference to the drawings.

Figure 2A:
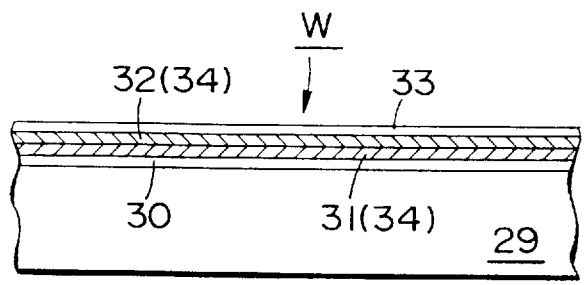
FIGS. 2A~2L are section views cut along line A—A in FIG. 1, showing the production process of the same DRAM memory cell in steps.

First, as shown in FIG. 2A, a silicon oxide film 30 (first insulation film) having a thickness of approximately 50~200 nm is formed by a thermal oxidation method onto the surface of a wafer W composed of a p-type silicon substrate 29 (semiconductor substrate). Subsequently, a non-doped polycrystalline silicon film 31 (a portion of the conductive film) which is not doped with impurities and has a thickness of approximately 50~100 nm, and a polycrystalline film 32 (a portion of the conductive film) which is doped with phosphorus in a concentration of approximately $1 \times 10^{21} \sim 10 \times 10^{21}/cm^3$ and has a thickness of approximately 50~100 nm are sequentially formed by a CVD (chemical vapor deposition) method. Then, a silicon oxide film 33 (second insulation film) having a thickness of approximately 50~200 nm is formed by a CVD method. The two above-mentioned polycrystalline silicon films 31 and 32 ultimately form the field-shield gate electrode 34.

Figure 2B:
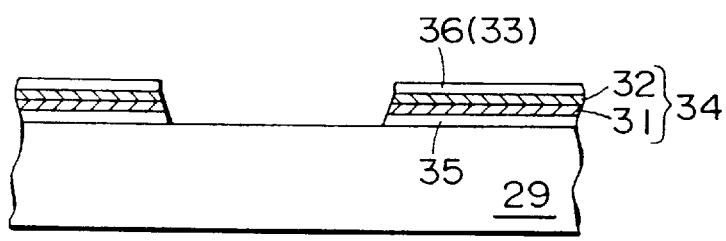

Next, as shown in FIG. 2B, the four above-mentioned films 30, 31, 32 and 33 are patterned into a designated shape by a photolithography method, after which a field-shield gate oxide film 35 (field-shield gate insulation film), a field-shield gate electrode 34 and a field-shield gate cap insulation film 36 are formed. At this time, only the topmost silicon oxide film 33 is etched using photoresist (not shown in the drawing) as a mask to form a field-shield gate cap insulation film 36, then the photoresist is removed.

Next, both the non-doped polycrystalline silicon film 31 and the phosphorus-doped polycrystalline silicon film 32 are dry etched at once with the field-shield gate cap insulation film 36 as a mask. In this case, the etching conditions are such that side-etching occurs; the pressure is 200~300 mTorr and the etching gas is a mixed gas of He at 400~500 sccm and $Cl_2$ at 100~200 sccm. When the etching is conducted under these conditions, the etching rate of the phosphorus-doped polycrystalline silicon film 32 is 30~50% faster than that of the non-doped polycrystalline silicon film 31, so that the amount of side-etching which occurs during the etch differs between the films, and a gradually tapered incline is formed on the side walls of the field-shield gate electrode 34.

Figure 2C:
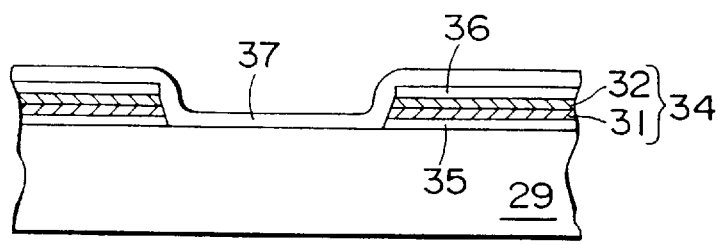
Figure 2D:
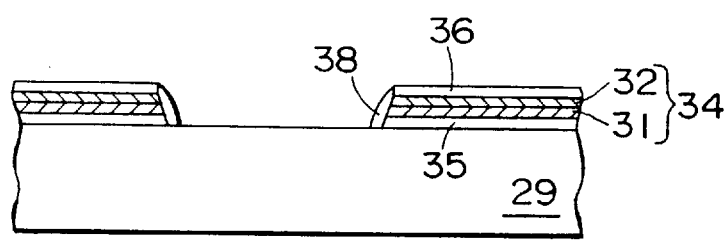
Figure 2E:
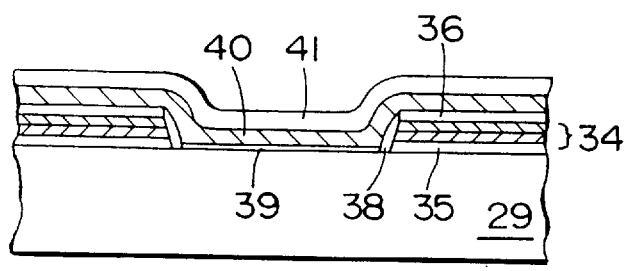

Next, as shown in FIG. 2C, a silicon oxide film 37 having a thickness of approximately 150~300 nm is formed over the entire surface of the wafer W by means of a CVD method. Thereafter, as shown in FIG. 2D, an anisotropic etching is conducted to form side wall spacers 38 on the side walls of the field-shield gate electrode 34. Then, as shown in FIG. 2E, a silicon oxide film 39 having a thickness of approximately 10~30 nm is formed on the surface of the p-type silicon substrate 29 by means of a thermal oxidation method, after which a phosphorus-doped polycrystalline silicon film 40 having a thickness of approximately 100~200 nm and a silicon oxide film 41 having a thickness of approximately 150~300 nm are sequentially formed over the entire surface of the wafer W by means of a CVD method. The high-temperature thermal treatment (at 800°~900° C.) of this thermal oxidation process causes the phosphorus in the phosphorus-doped polycrystalline silicon film 32 to diffuse into the non-doped polycrystalline silicon film 31, so that the concentration in the field-shield gate electrode is averaged out.

Figure 2F:
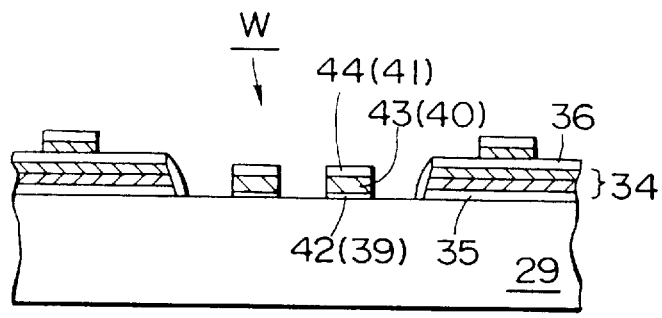
Figure 2G:
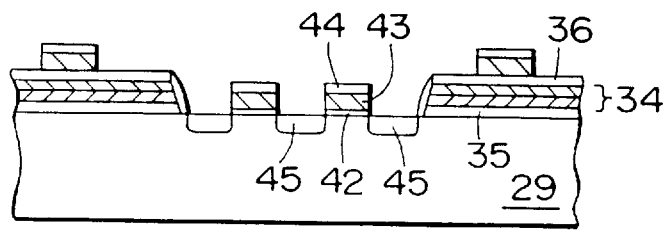
Figure 2H:
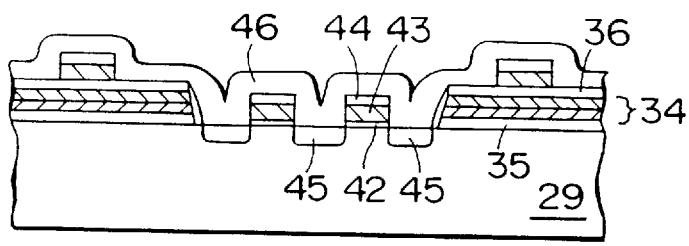

Subsequently, as shown in FIG. 2F, the three above-mentioned films 39, 40 and 41 are patterned into a designated shape by a photolithography method, so as to form a gate oxide film 42, a gate electrode 43 and a gate cap insulation film 44 for a MOS transistor. Next, as shown in FIG. 2G, phosphorus ions are implanted with an acceleration energy of 30~50 keV and a dose of $1\times10^{13}$~$10\times10^{13}$/cm² using the films 42, 43 and 44 as a mask so as to form an n-impurity diffusion layer 45. Then, as shown in FIG. 2H, a silicon oxide film 46 is formed over the entire surface of the wafer W by means of a CVD method.

Figure 2I:
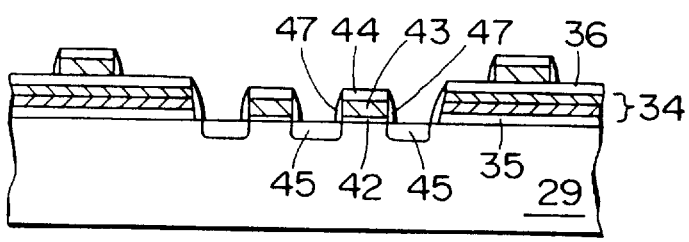
Figure 2J:
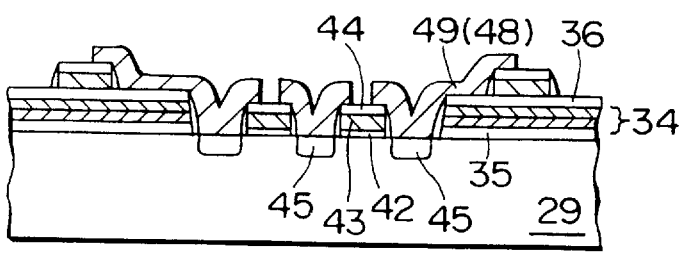

Subsequently, as shown in FIG. 2I, an anisotropic etch is performed to form side wall spacers 47 on the side walls of the gate electrode 43 of the MOS transistor. Then, as shown in FIG. 2J, a polycrystalline silicon film 48 which is doped with phosphorus at a concentration of approximately $1\times10^{21}$~$10\times10^{21}$/cm³ and has a thickness of approximately 150~300 nm is formed over the entire surface of the wafer W by means of a CVD method, after which this is patterned into a designated shape by a photolithography method in order to form a bottom electrode 49 of a capacitor. During this step, the non-doped polycrystalline silicon film may be implanted with phosphorus or arsenic by an ion implantation method after formation, instead of forming a phosphorus-doped polycrystalline silicon film 48 by means of a CVD method.

Figure 2K:
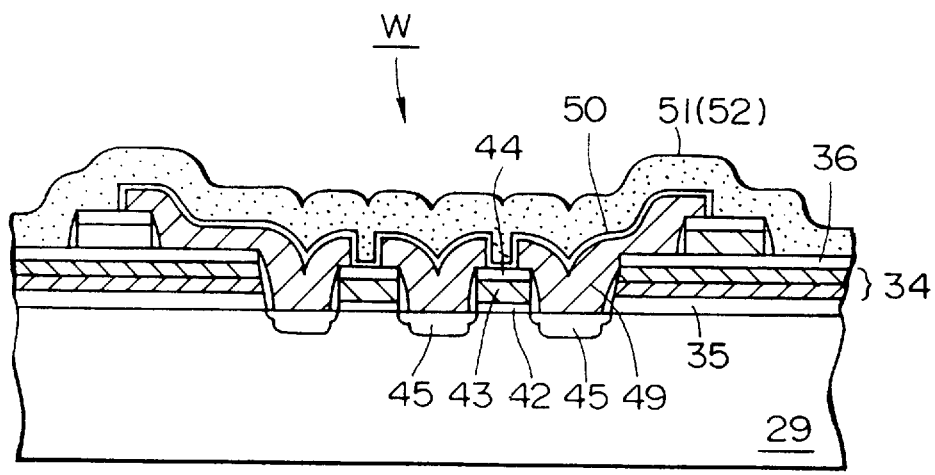

Thereafter, as shown in FIG. 2K, a silicon nitride film (not shown in the drawings) having a thickness of approximately 5~10 nm is formed by a CVD method and a silicon oxide film (not shown in the drawings) having a thickness of approximately 1~5 nm is formed by a thermal oxidation method on top of the bottom electrode 49 of the capacitor, so as to form a capacitor dielectric film 50 formed from these two layers. Furthermore, after forming a phosphorus-doped polycrystalline silicon film 51 having a thickness of approximately 150~300 nm on the top surface by means of a CVD method, this is patterned into a designated shape by means of a photolithography method in order to form a top electrode 52 for the capacitor.

Figure 2L:
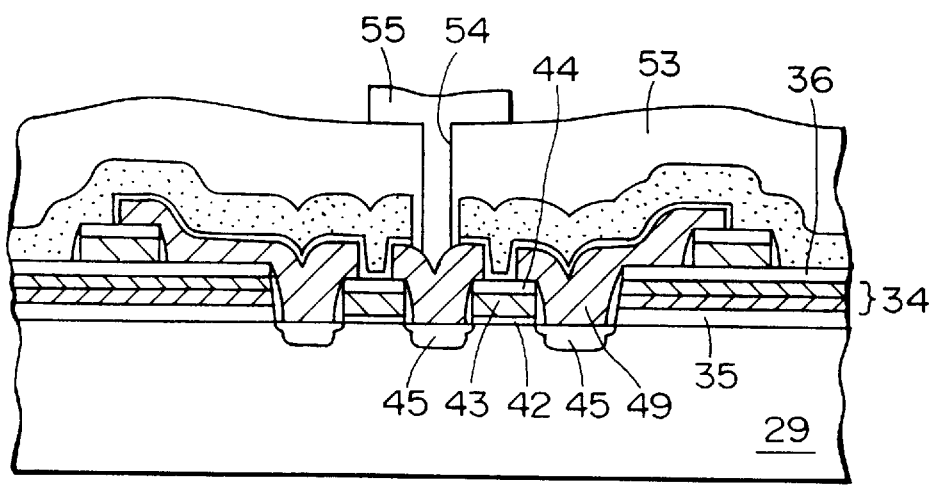
Figure 3:
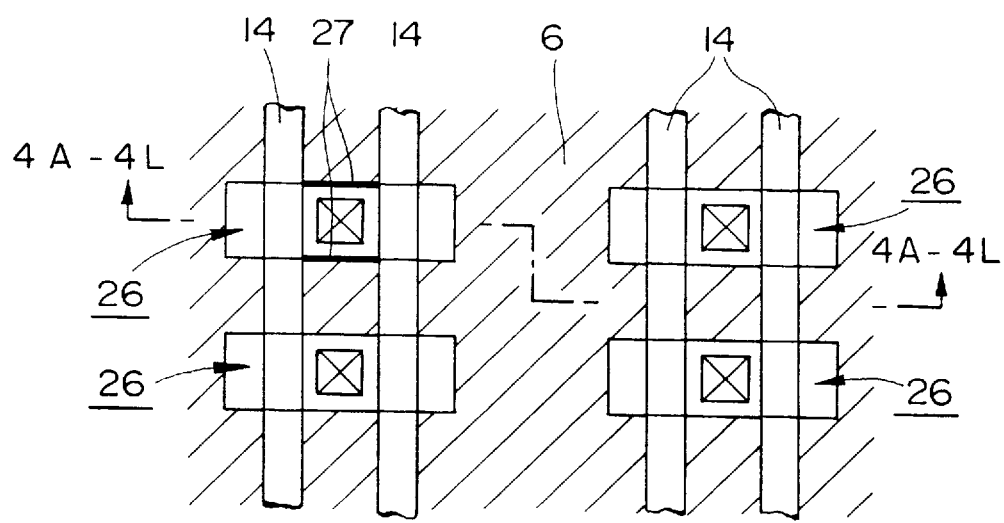
FIG. 3 is a plan view showing an example of a conventional DRAM memory cell.
Figure 4A:
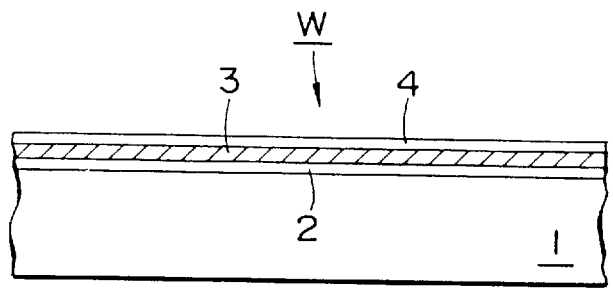
FIGS. 4A~4L are section views cut along line B—B in FIG. 3, showing the production process of the same DRAM memory cell in steps.
Figure 4B:
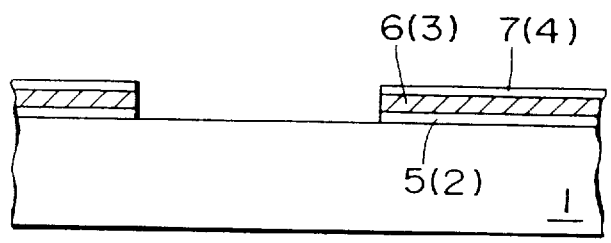
Figure 4C:
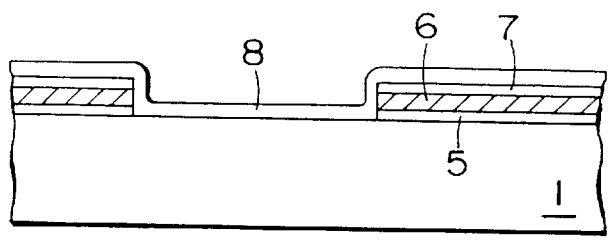
Figure 4D:
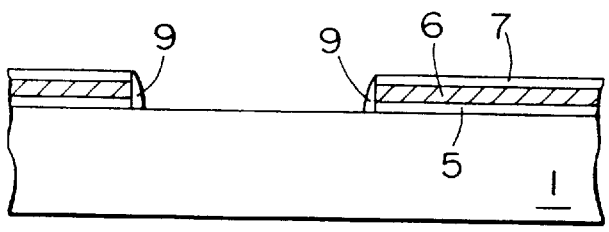
Figure 4E:
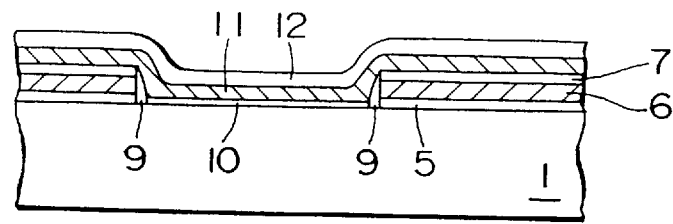
Figure 4F:
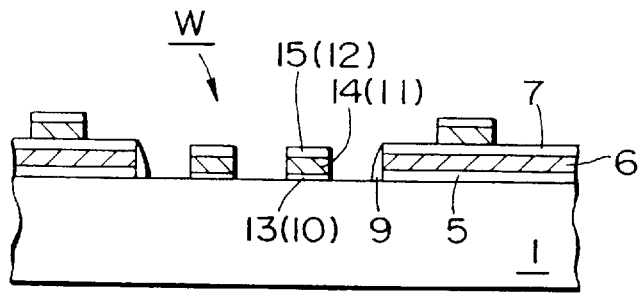
Figure 4G:
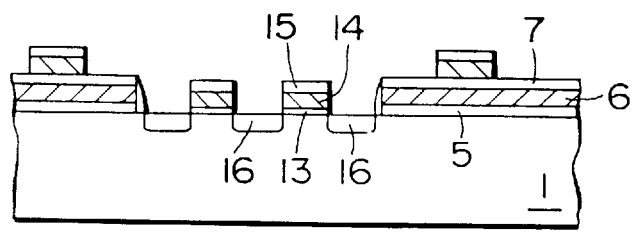
Figure 4H:
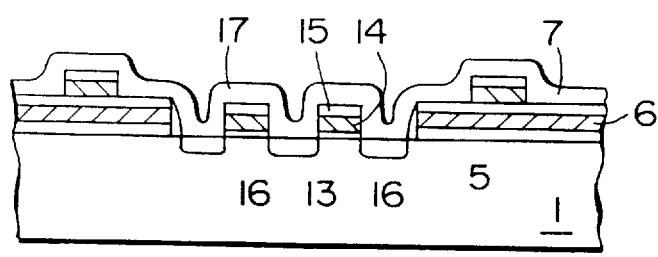
Figure 4I:
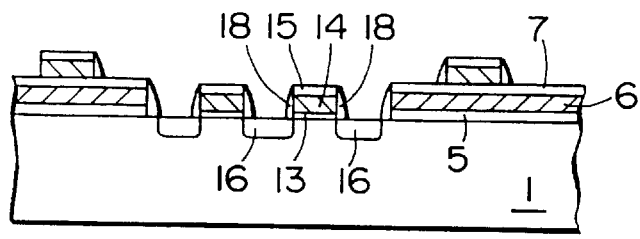
Figure 4J:
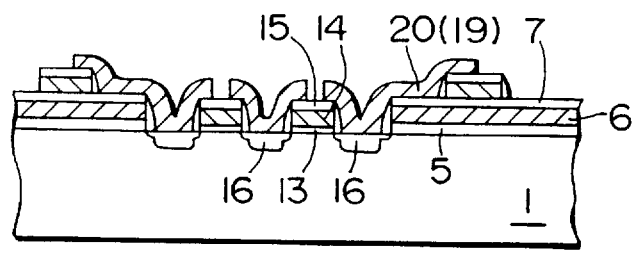
Figure 4K:
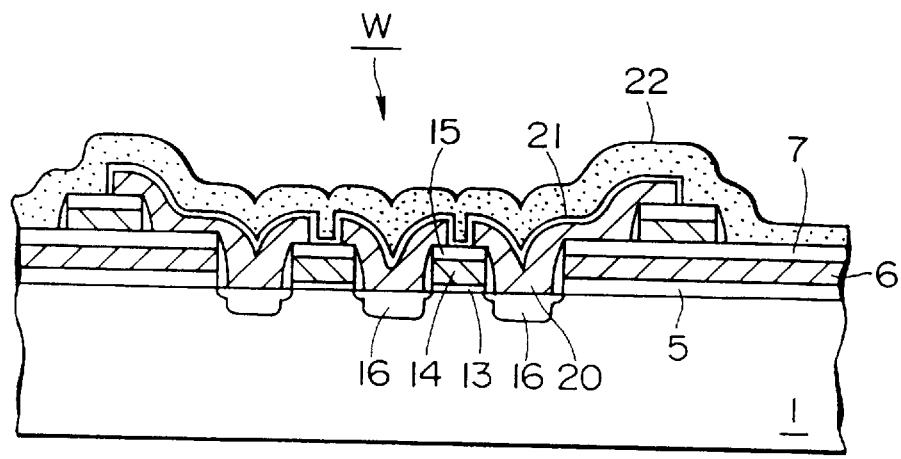
Figure 4L:
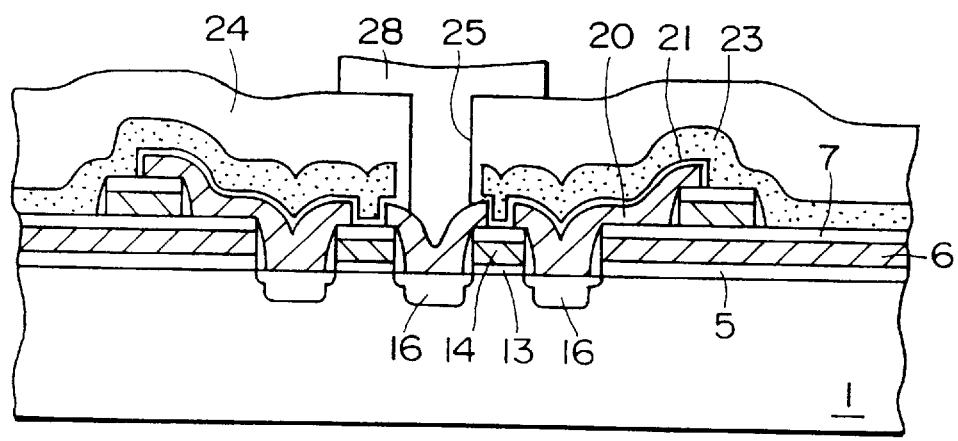

Then, as shown in FIG. 2L, after forming an interlayer insulation film 53 composed of a BPSG film or the like having a thickness of approximately 500~800 nm by means of a CVD method, contact holes 54 are opened at designated locations by means of a photolithography method, and a metal wiring layer 55 composed of TiW or the like having a thickness of approximately 300~500 nm is formed by means of a sputtering method. A DRAM memory cell having a field-shield isolation structure is formed by following the above steps.

The DRAM memory cell production method according to the present embodiment takes advantage of the differences in the etching rate when the field-shield gate electrode 34 is composed of a layered film of non-doped polycrystalline silicon film 31 and phosphorus-doped polycrystalline silicon film 32 in order to easily form a gradually tapered incline on the side walls of a field-shield gate electrode 34. Furthermore, the incline of the side wall is made smooth by forming side wall spacers 38 on the side walls of the field-shield gate electrode 34. For this reason, as shown in FIG. 1, etching residues are not formed at the step portions of the gate electrodes 43 of the MOS transistor, so that the gate electrode 43 can be easily fabricated even if the active region 56 becomes smaller with scaling down. Therefore, short-circuits can be prevented between adjacent gate electrodes 43 on the MOS transistor (reference numeral 57 in FIG. 1), so as to allow yield reductions to be controlled.

Furthermore, the side walls of the field-shield gate electrode 34 do not become curved as with conventional methods which use isotropic etching, and form excellent gradually tapered shapes so as to reliably prevent the generation of etching residues. Additionally, there is no need to change the etchant concentration for each semiconductor wafer as with the conventional method wherein the etching rate is sequentially changed, so that the etching conditions can be held constant during the etching. Therefore, the product throughput and etching controllability can be maintained.

The technical scope of the present invention is not restricted by the present embodiment, and various modifications are possible as long as they do not contradict the gist of the present invention. For example, while a field-shield gate electrode 34 was formed from two non-doped and phosphorus doped polycrystalline silicon films 31 and 32 (which ultimately become polycrystalline silicon films with uniform concentrations) in the present embodiment, instead of this method, it is possible to form a single layer polycrystalline silicon film from the beginning by increasing the implanted amount of phosphorus over time when forming the polycrystalline silicon film by means of a CVD method, so that the concentration of the upper layer side (the field-shield gate cap insulation film side) becomes higher.

Additionally, while the field-shield gate electrode 34 has two polycrystalline silicon films 31 and 32 in the present embodiment, it is also possible to have three or more layers, in which case phosphorus concentrations of the films on the upper layer side should be made higher. Furthermore, instead of using polycrystalline silicon films as the field-shield gate electrode materials, it is possible to use other conductive films having similar properties, or to form the field-shield gate electrode by layering different types of conductive materials having different etching rates depending on the case. Additionally, the materials and thicknesses of the films, as well as the specific conditions of each step in the present embodiment may of course be modified as is appropriate. Additionally, the present invention can be applied not only to DRAM memory cells, but also to other semiconductor devices having a field-shield isolation structure.

As explained in detail above, the semiconductor device production method of the present invention allows a gradually tapered incline to be easily formed on the side walls of the field-shield gate electrode by taking advantage of the difference in etching rate between the top portion and the bottom portion of a conductive film. Therefore, a gate electrode can be easily fabricated without leaving etching residues at the step portions in the active regions of the gate electrode of a MOS-type semiconductor element. Consequently, short-circuits between the gate electrodes can be prevented from occurring and the resulting yield reductions can be controlled. Furthermore, since the side walls of the field-shield electrode form excellent tapered shapes with the present invention in comparison to the methods using isotropic etching, the occurrence of etching residues can be reliably prevented, and unlike conventional methods wherein the etching rate is gradually changed, the etching conditions can be held constant so that the product throughput and etching controllability can be maintained.

I claim:

1. A production method for a semiconductor device having a field-shield isolation structure, provided with a field-shield gate electrode and a field-shield gate insulation film for electrically insulating a plurality of elements formed on a semiconductor substrate, said production method comprising steps of:

forming a first insulation film, to be a field-shield gate insulation film, on a semiconductor substrate;

forming a conductive film, wherein an upper portion has a higher etching rate than a lower portion under identical etching conditions, to be a field-shield gate electrode, on said first insulation film;

forming a second insulation film on said conductive film;

patterning said second insulation film into a designated shape; and etching said conductive film under conditions which allow for side etching with the patterned second insulation film as a mask, so as to make gradually tapered inclines on side walls of said conductive film.

2. A production method for a semiconductor device according to claim 1, wherein side wall spacers are formed on said side walls of said conductive film after the gradually tapered inclines are made on said side walls of said conductive film.

3. A production method for a semiconductor device having a field-shield isolation structure, provided with a field-shield gate electrode and a field-shield gate insulation film for electrically insulating a plurality of elements formed on a semiconductor substrate, said production method comprising steps of:

forming a first insulation film, to be a field-shield gate insulation film, on a semiconductor substrate;

forming a conductive film, wherein an upper portion has a higher etching rate than a lower portion under identical etching conditions, to be a field-shield gate electrode, on said first insulation film;

forming a second insulation film on said conductive film;

patterning said second insulation film into a designated shape; and etching said conductive film under conditions which allow for side etching with the patterned second insulation film as a mask, so as to make gradually tapered inclines on side walls of said conductive film, wherein said conductive film is formed by forming at least two layers of films having different etching rates.

4. A production method for a semiconductor device according to claim 3, wherein said at least two layers of films comprise at least two layers of polycrystalline silicon films implanted with different concentrations of impurities.

5. A production method for a semiconductor device according to claim 4, wherein said impurities are phosphorus.

6. A production method for a semiconductor device according to claim 4, wherein said at least two layers of films comprise a non-doped polycrystalline silicon film which does not contain impurities positioned on a bottom layer side, and a polycrystalline silicon film doped with phosphorus positioned on a top layer side.

7. A production method for a semiconductor device having a field-shield isolation structure, provided with a field-shield gate electrode and a field-shield gate insulation film for electrically insulating a plurality of elements formed on a semiconductor substrate, said production method comprising steps of:

forming a first insulation film, to be a field-shield gate insulation film, on a semiconductor substrate;

forming a conductive film, wherein an upper portion has a higher etching rate than a lower portion under identical etching conditions, to be field-shield gate electrode, on said first insulation film;

forming a second insulation film on said conductive film;

patterning said second insulation film into a designated shape; and etching said conductive film under conditions which allow for side etching with the patterned second insulation film as a mask, so as to make gradually tapered inclines on side walls of said conductive film, wherein said conductive film is formed by forming a single polycrystalline silicon film while changing the concentration of implanted impurities over time during formation.

8. A production method for a semiconductor device according to claim 7, wherein said impurities are phosphorus.

* * * * *